(12) United States Patent
MacAuley et al.

(10) Patent No.: US 7,757,384 B2
(45) Date of Patent: Jul. 20, 2010

(54) APPARATUS FOR FORMING A HERMETIC SEAL ABOUT A CABLE EXTENDING FROM A WATERPROOF POUCH

(76) Inventors: Andrew S. MacAuley, 7 Bessemer Park, 250 Milkwood Road, London (GB) SE24 OHG; Charles Brian Durler Cooke, 6 Brookside, Orwell, Royston, Hertfordshire (GB) SG8 5TQ; Christopher Benjamin James Groombridge, 19 Ullswater Close, Stevenage, Hertfordshire (GB) SG1 6AF; Nicholas John Bowman, Dillard House, 8a Cross Lane Close, Orwell, Royston, Hertfordshire (GB) SG8 5QW ( * ) Notice: Subject to any disclaimer, the term of this patent is extended or adjusted under 35 U.S.C. 154(b) by 552 days.

(21) Appl. No.: 11/333,089

(22) Filed: Jan. 17, 2006

(65) Prior Publication Data

US 2007/0014491 A1    Jan. 18, 2007

Related U.S. Application Data

(60) Provisional application No. 60/699,279, filed on Jul. 13, 2005.

(51) Int. Cl.
B65D 33/16 (2006.01)
H05K 5/06 (2006.01)
(52) U.S. Cl. .................... 29/745; 24/30.5 R; 174/50.5; 383/59; 383/68; 383/78; 383/92
(58) Field of Classification Search ................ 29/855, 29/856, 858, 868, 745, 748, 755; 174/50, 174/50.5, 138 F; 24/30.5 R, 30.5 L, 30.5 S; 383/59, 68, 78, 79, 84, 92; 439/367
See application file for complete search history.

(56) References Cited

U.S. PATENT DOCUMENTS 1,038,351 A    9/1912    Graham (Continued)

FOREIGN PATENT DOCUMENTS

GB    221458    9/1924

(Continued)

OTHER PUBLICATIONS

Aquapac (Booklet), © Aquapac 2005, 34 pages.

*Primary Examiner*—Derris H Banks
*Assistant Examiner*—Livius R Cazan
(74) *Attorney, Agent, or Firm*—Trellis IP Law Group, PC

(57) ABSTRACT

The present invention provides an apparatus for protecting a device from water damage. The apparatus is capable of being repeatedly opened and then hermetically sealed even when the device has a wire that must be extended outside of the apparatus. The present invention comprises a housing having at least two members that, when juxtaposed and clamped, form a dry interior region. More specifically, each member includes a pair of gaskets that together define the dry interior region and substantially form a hermetic seal about a pouch or container. The apparatus includes a portal through which the wire may extend from a device inside the pouch or container to the outside and a slide mechanism that adjust a gasket around the wire to maintain the dry interior region. The slide mechanism forms a hermetic seal around the wire so that the opening in the pouch from which the wire extends is hermetically sealed. If no wire is present, the slide mechanism may be adjusted to maintain the hermetic seal.

7 Claims, 6 Drawing Sheets

U.S. PATENT DOCUMENTS

| | | | |
|---|---|---|---|
| 1,540,005 A | 6/1925 | Hiering | |
| 1,566,867 A | 12/1925 | Hetzer et al. | |
| 1,823,155 A * | 9/1931 | McArdle | 383/108 |
| 1,931,707 A | 10/1933 | Quigan | |
| 2,278,365 A * | 3/1942 | Daniels | 310/29 |
| 2,304,528 A | 12/1942 | Bafia | |
| 2,599,738 A | 6/1952 | Ames | |
| 2,616,470 A | 11/1952 | Rifkin | |
| 2,678,671 A | 5/1954 | Rifkin | |
| 3,380,087 A * | 4/1968 | Petty et al. | 219/217 |
| 3,576,937 A * | 5/1971 | Eldridge, Jr. | 174/92 |
| 4,175,604 A | 11/1979 | Bonner | |
| 4,456,797 A | 6/1984 | Olsen | |
| 4,584,718 A | 4/1986 | Fuller | |
| 4,982,841 A | 1/1991 | Goedecke | |
| 5,368,500 A * | 11/1994 | Dedering | 439/367 |
| 5,797,683 A | 8/1998 | Gunzi et al. | |
| 6,036,526 A * | 3/2000 | Alfis, III | 439/369 |
| 6,042,416 A * | 3/2000 | Lopes | 439/500 |
| 6,218,620 B1 * | 4/2001 | Michel | 174/92 |
| D452,377 S | 12/2001 | Cooke et al. | |
| 6,954,405 B2 * | 10/2005 | Polany et al. | 367/131 |

FOREIGN PATENT DOCUMENTS

| | | |
|---|---|---|
| GB | 2161138 A | 1/1986 |
| GB | 2179323 A | 3/1987 |

* cited by examiner

APPARATUS FOR FORMING A HERMETIC SEAL ABOUT A CABLE EXTENDING FROM A WATERPROOF POUCH

RELATED APPLICATIONS

This application claims the benefit of U.S. Provisional Application No. 60/699,279, filed Jul. 13, 2005, which is incorporated herein by reference in its entirety.

BACKGROUND OF THE INVENTION

The present invention relates in general to an apparatus having a pouch for carrying a water sensitive device and an integral housing. More specifically, the present invention relates to an apparatus and method for forming a hermetic seal around a wire of various diameters extending from the device while it is positioned in the pouch.

In this modern era, electronic devices play an increasingly important role in every day life. Often these devices are used for communication, medical or other uses and they are often susceptible to damage when exposed to water. For this reason, many different types of waterproof containers or pouches have been made in an effort to protect the devices from the damaging effects of water. However, such devices often have a wire that must extend from the pouch to the outside for a user to access. The wire may be used as an external electronic connection, headphones, microphone or the like. Unfortunately, with many of the prior art waterproof pouches, when the wire extends outside the pouch, the hermetic seal is broken thereby exposing the device to water damage. Many prior art hermetically sealed pouches ignore the problem and simply do not allow the use of an externally connecting wire with the device inside the pouch. This limitation is clearly undesirable and, as such, these pouches severely limit the use of most modern electronics equipment. It is simply unacceptable that the prior art pouches requires the user to choose between using the device or protecting the device from water damage.

To address the need of users who must have access to a wire that extends from the device to the outside of the pouch, other prior art devices have attempted to provide a waterproof pouch with an intermediate connection that connects with the device inside the pouch. This built in electrical connection enables the user to plug in, for example, a pair of headphones and continue using the device. A significant disadvantage of this is that there is no provision for other types of connective wire, or connection to other types of equipment other than headphones supplied with the pouch. Clearly, a pouch having a dedicated connection is inefficient and unnecessarily limiting. Further, the external connection is susceptible to the damaging effects of the elements so that when it is necessary to use the external connector, the probability of failure is unreasonably high.

Another problem with the prior art devices is that the hermetic seal cannot be reformed around the pouch once the device and the wire are removed from the pouch. Further, another problem arises because not all devices have similar terminating connectors or wire diameters. Thus, there is a great need for a versatile apparatus that may adapt to a particular device and that can form a hermetic seal around any type of wire without requiring the use of adaptor plugs. Further still, there is a great need for a versatile apparatus that is adaptable from device to device so that a hermetic seal may be applied around various diameter wires or no wire at all.

What is needed is an apparatus that may repeatedly form the hermetic seal around a pouch when an external wire, connected to the device inside the pouch, is present or even when the wire is not present.

SUMMARY OF EMBODIMENTS OF THE INVENTION

The present invention provides an apparatus for protecting a device from water damage. The apparatus is capable of being repeatedly opened and then hermetically sealed even when the device has a wire that must be extended outside of the apparatus. The present invention comprises a housing having at least two members that, when juxtaposed and clamped, form a dry interior region. More specifically, each member includes a pair of gaskets that together define the dry interior region and substantially form a hermetic seal about a pouch or container. The apparatus includes a portal through which the wire may extend from a device inside the pouch or container to the outside and a slide mechanism that adjust a gasket around the wire to maintain the dry interior region. The slide mechanism forms a hermetic seal around the wire so that the opening in the pouch from which the wire extends is hermetically sealed. The slide mechanism may be adjusted to maintain the hermetic seal even if no wire is present in the portal.

Advantageously, the apparatus may be used with a wire extending from inside the pouch to the outside or without an extended wire. Further, the housing may be operated to open the housing to gain access to the interior of the pouch or container and then closed. This operation may be repeated any number of times as the hermetic seal if reformed each time the apparatus is opened and then closed. Advantageously, the hermetic seal is reformed when closed if a wire is present or even if a wire is not present. The apparatus is well suited for implementation in portable electronic devices such as cellular telephones, PDAs, portable computers, other electronic or medical devices or any device having a cord that must be protected from the environment but that also has a wire or similar device that must be accessed from outside the apparatus. These and other features as well as advantages that categorize the present invention will be apparent from a reading of the following detailed description and review of the associated drawings.

DETAILED DESCRIPTION OF EMBODIMENTS OF THE INVENTION

In the description herein for embodiments of the present invention, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, parts, and/or the like. In other instances, well-known structures, materials, or operations are not specifically shown or described in detail to avoid obscuring aspects of embodiments of the present invention.

Figure 1:
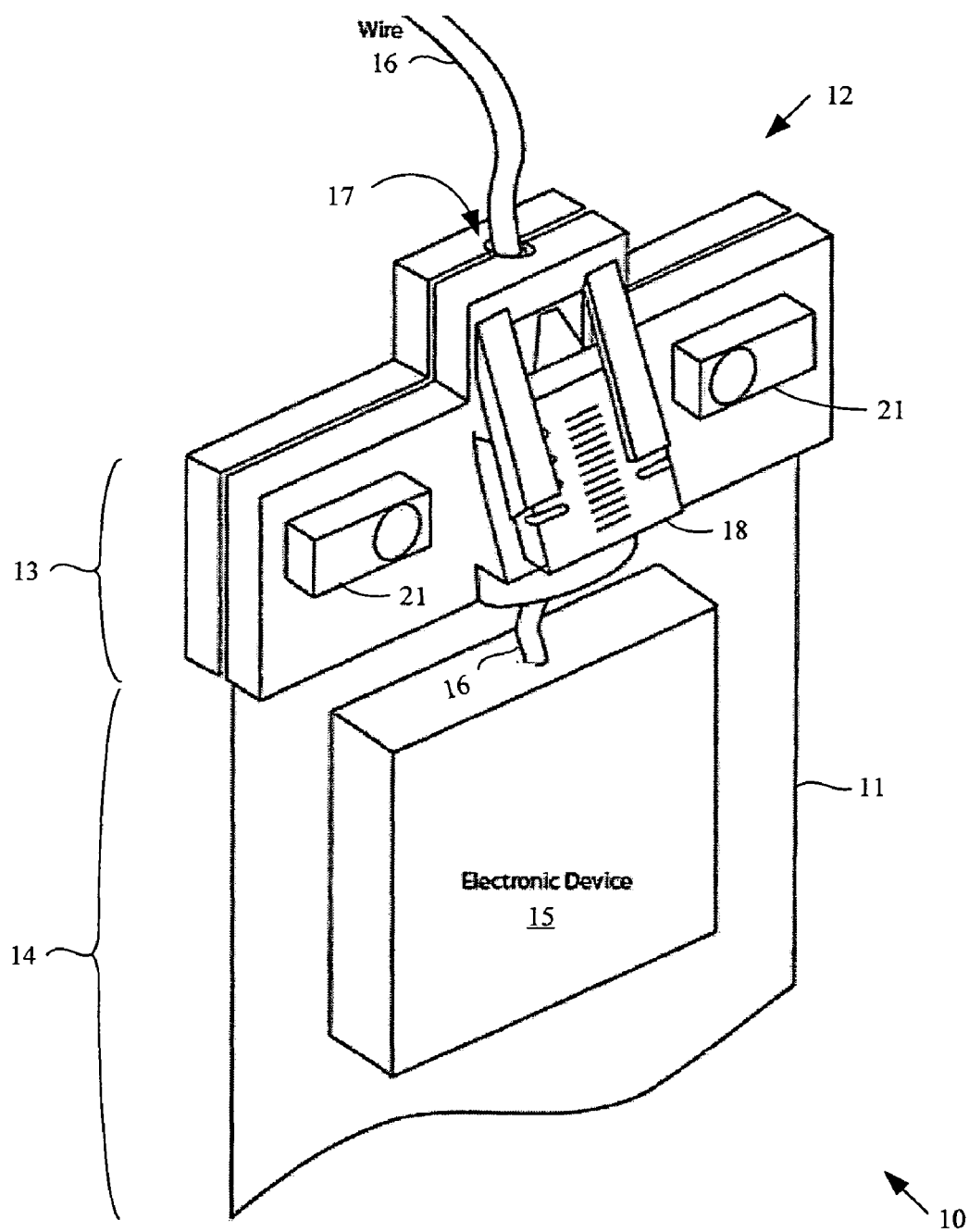
FIG. 1 is a simplified diagram illustrating an apparatus for protecting a water sensitive device while permitting access to a wire extending from the device to the outside of the apparatus in accordance with an embodiment of the present invention.

Referring now to the drawings more particularly by reference numbers, an embodiment of a waterproof container 10 is illustrated in FIG. 1. Container 10 includes a preformed pouch 11 and a housing 12. A portion of pouch 11, indicated generally at 13, is positioned in the interior of housing 12 and a portion of pouch 11, indicated generally at 14, extends outside of housing 12. There is no limit on dimensions of the pouch that is outside of housing 12, the only requirement is that there is no seam or opening in the pouch where water could enter. In one embodiment, pouch is any of numerous organic synthetic or processed materials that are mostly thermoplastic or thermosetting polymers of high molecular weight and that can be made into sheets. Typically, pouch 11 is about four to six mils (0.4 mm to 0.6 mm) thick although the thickness of the pouch is not a critical parameter. However, it should be noted that housing 12 must have sufficient dimensions to adapt to the size and type of the container.

The portion 13 of pouch 11 that is positioned in the interior of housing 12 includes an opening to the interior of the pouch. Without housing 12, water may enter the interior of pouch 11 through the opening. However, housing 12 creates a hermetic seal around the open end of the pouch 11 so that the opening is trapped in a 'dry' environment and thus protected from water ingress.

Preferably, before forming the hermetic seal, an electrical or electronic device 15 is positioned inside of pouch 12. Electronic device 15 may be any type of electrical or electronic apparatus. Common examples include a cellular telephone, a MP3 music player, a VHF or marine radio, an insulin pump, a medical monitoring device or any other portable electronic or electrical device. In many applications, electronic device 15 has a wire 16 that extends from device 15, it being understood that the wire may be permanently attached to device 15 or attached by an electrical connector. Wire 16 may be a plastic or rubber coated electrical conductors used to couple device 15 to an external device such as a microphone, headphone or control unit (not shown). In other devices, wire 16 may be a power cord or a data cable used to electrically link two or more devices together. With many medical devices, wire 16 may be a hollow plastic tube or catheter. In still other instances such as a heart monitor, wire 16 may couple external sensors (not shown) to a recording or monitoring device that is carried in container 10. In view of these few itemized representative uses for wire 16, it will be apparent that wire 16 may vary considerably in diameter. Further, wire 16 may also vary considerably in function and the manner in which it connects or attaches to device 15. Accordingly, it is necessary that housing 12 be sufficiently adaptable so that a user of container 10 is not limited to a particular size, type of wire 16 or manner of attachment.

In many applications, it is necessary for wire 16 be readily accessible from outside of the pouch while maintaining the hermetic seal around the opening and the wire. In accordance with an embodiment of the present invention, housing 12 includes a portal 17 through which wire 16 extends. In other applications, the electronic device 15 does not include a wire or the wire is carried fully inside the pouch 11. When wire 16 is not present or is not brought to the outside, housing 12 must be sufficiently adaptable to completely seal off the portal and maintain the hermetic seal around the opening. To achieve this flexibility, housing 12 includes a slide lever 18 that maintains the hermetic seal around wire 16 regardless of the diameter of the wire or seals the portal if the wire is not present. Thus, the hermetic seal is maintained regardless of whether wire 16 extends from container 10 or not.

Housing 12 comprises two opposing members 19 and 20. When members 19 and 20 are maintained in the orientation illustrated in FIG. 1, referred to as the closed position, a hermetic seal is formed around an interior void. The open end of pouch 11 is maintained within the interior void. In one embodiment, members 19 and 20 are maintained in the closed position by bayonet levers 21 and 22 that operate to repeatably pull members 19 and 20 from a spaced apart relationship to the closed position and to form the hermetic seal. When members 19 and 20 are in the closed position, slide lever 18 operates to independently maintain the hermetic seal around wire 16 as it exits portal 17.

It is preferred that bayonet levers 21 or any housing clamping mechanism is permanently coupled to one of said opposing members and adapted to selectively engage the opposing member such that said opposing members may be selectively either separated to permit ready access to the interior of the pouch or engaged such that housing is in a closed position and a hermetic seal is formed.

Figure 2:
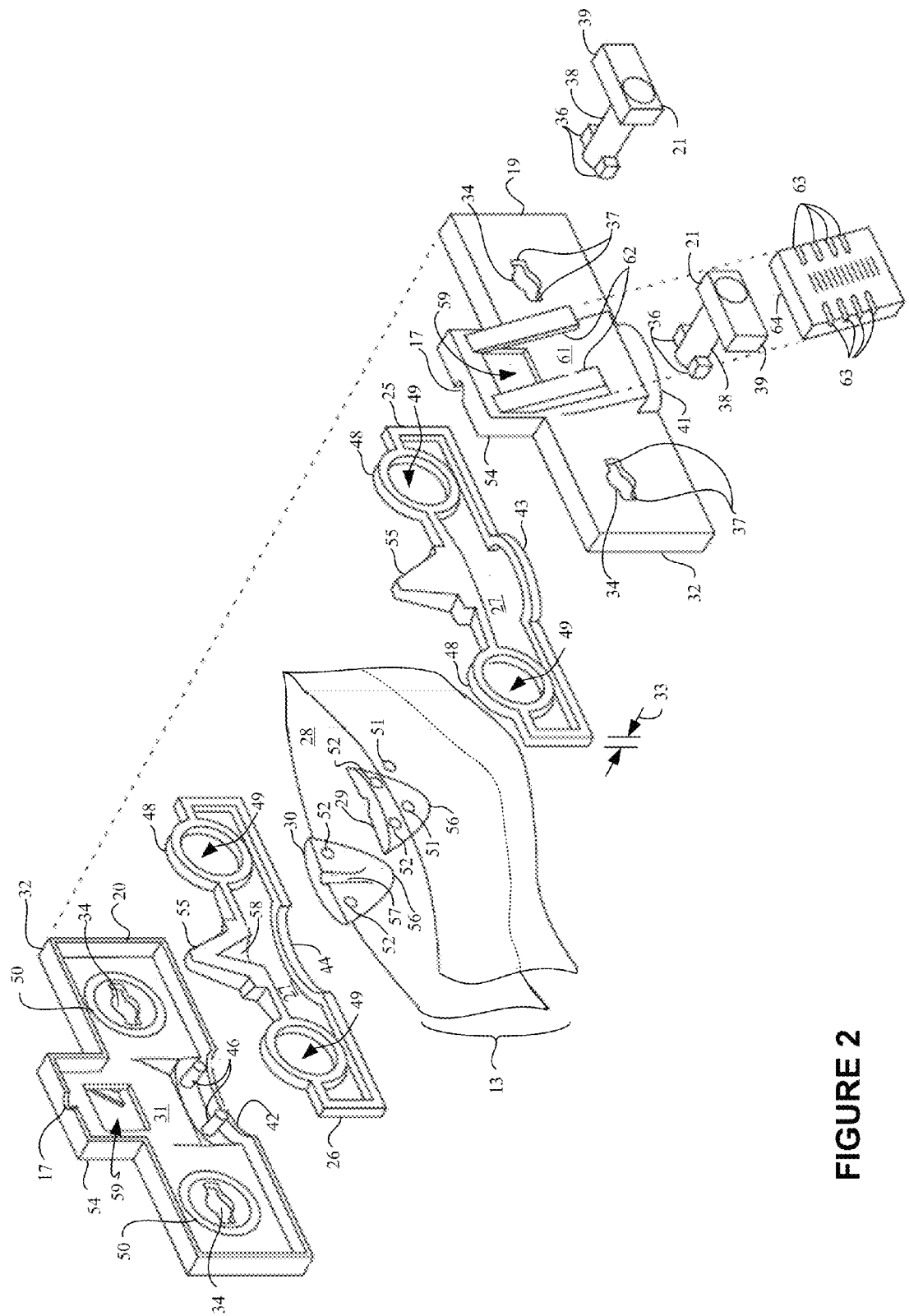
FIG. 2 illustrates an exploded perspective view of the apparatus shown in FIG. 1 in accordance with an embodiment of the present invention.

FIG. 2 shows an exploded view of housing 12. More specifically, a pair of gaskets 25 and 26 is disposed between members 19 and 20. Each gasket may be made from silicon, a closed cellular foam material, rubber or other compressible material that is impermeable to water. Gaskets 25 and 26 partially define a void 27 in which opening 28 is positioned when housing 12 is in the closed position. Preferably, gaskets 25 and 26 are fixedly attached to member 19 and 20 so that gaskets 25 and 26 are retained in the desired spatial relationship with the respective members. Gasket attachment may be achieved with glue, clips, clamps, friction, a tongue-and-groove complementary structure or other means.

Opening 28 is formed in a portion 13 of the pouch and may, although it is not required, extend across the width of pouch 11. It is preferred that opening be of sufficient size to permit electronic device 15 to be inserted into the interior of pouch 11. Although illustrated as an opening that extends the entire width of pouch 11 it will be appreciated that in an alternative embodiment the edge of pouch 11 may include a re-sealable complementary tongue and groove structure (not shown). In still other embodiments, opening is located in one end of a pre-formed pouch. In still other embodiments, pouch 11 may have side edges that have expandable bellows or folds to allow the dimensions of the interior of pouch 11 to expand so that larger items may be placed inside pouch 11.

A pair of inner gaskets 29 and 30 is positioned in the interior of pouch portion 13 and is responsible for forming a hermetic seal around wire 16, if present, or, alternatively, to form a hermetic seal if no wire 16 is present. Each inner gasket has a substantially flat inside face and a generally flattened ellipse outside. Inner gaskets 29 and 30 are also preferably made from silicon, a closed cellular foam material, rubber, other compressible material or other material that is impermeable to water. It is recognized that inner gaskets may, in some less than critical applications, be made from relatively hard material such as a waxed paper or other non-compressible waterproof material. Note that opposing sides of portion 13 are sandwiched between gaskets 25 and 29 and between 26 and 30, respectively. Gaskets 25 and 26, in turn, are sandwiched between face 31 of each member 19 and 20 and pouch 11. Thus, each sheet of pouch 11 is trapped between the combined member and gasket (19 and 25 and 20 and 26) and a corresponding inner gasket 29 or 30. Within void 27, opening 28 in pouch 11 is trapped in a 'dry' environment and thus protected from water ingress. Gaskets 25 and 26 form the hermetic seal around the opening in pouch 11 when engaged by the levers 21.

When gaskets 25 and 26 are positioned against members 19 and 20, sidewalls 32 extend over gaskets 25 and 26 but it should be noted that the width of sidewall 32 is less than the thickness 33 of gaskets 25 and 26. However, when housing 12 is in the closed position, the gaskets 25, 26, 29 and 30 are compressed and sidewalls 32 of members 19 and 20 will be in physical contact. Void 27 is hermetically sealed as faces 31 compress juxtaposed gaskets 25 and 26, pouch 11 and inner gaskets 29 and 30.

To maintain housing 12 in the closed position, members 19 and 20 each include a pair of keyed slots 34. One of the keyed slots 34 on member 19 are aligned with a corresponding one of the keyed slots 34 on member 20. When housing 12 is held in the hand of a user in a substantially closed position, bayonet levers 21 may be inserted through housing 12 and rotated into a locked position. To insert bayonet lever 21 through housing 12, a pair of projections 36 are aligned with tabs 37 of keyed slot 34. Shaft 38 is of sufficient length to allow projections 36 to exit housing 12 when it is held in a substantially closed position. However, housing 12 is in a watertight closed position only after projections 36 are rotated up an inclined ramp (not shown) and held in place by at least one detent to thereby clamp housing 12 into a closed position.

To assist in rotating projections 36 to the detent, locking lever 39 is provided on the opposite end of shaft 38 to provide the necessary leverage to easily rotate projections 36 into the proper orientation. Alternatively, projections 36 are rotated away from slots 37 by about ninety degrees (90°) with a cam lever that uses a camming action to apply and maintain sufficient pressure on gaskets 25 and 26 and inner gaskets 29 and 30 to clamp housing 12 in the closed position. In other embodiments, a clamp, elastic band that encircles housing 12 or a bolt and nut combination may be used in place of bayonet levers 21. Regardless of the mechanism used, it should be recognized that when housing 12 is clamped in a closed position, the gaskets are compressed by faces 31 and form a watertight hermetic seal around opening 28.

Gaskets 25 and 26 each include two annular rings 48 that each defines a void 49. Each annular ring 48 also surrounds a rib 50 on face 31. Rib 50 encircles keyed slot 34. The dimension of void 49 and rib 50 need only be sufficient to allow projections 36 of bayonet lever to pass through as housing 12 is being closed. In alternative embodiments, annular ring 48 is modified so that it is a semi-annular ring. In either embodiment, void 49 is exposed to water but void 27 remains watertight when housing is in the closed position.

It is important to note that additional structure is required before it is possible to maintain the hermetic seal when wire 16 extends to the outside of the pouch through opening 28. Thus, to maintain a hermetic seal around wire 16, each member 19 and 20 includes a boss 41 and 42, respectively. Boss 41 is sized to accept protuberance 43 of gasket 19. Similarly, boss 42 accepts protuberance 44. Each protuberance 43 and 44 receives the outer curved outside face portion of gaskets 29 and 30, respectively.

To maintain opening 28 in void 27 and the orientation of pouch portion 13 and gasket 30, boss 42 has at least a pair of pins 46 that extend through gasket 26, holes 51 in portion 13 and holes 52 in gasket 30. A similar set of pins 46 (not shown) extend from boss 41. In one embodiment, after pins 46 are positioned to maintain orientation, they are then treated to form a flatten head portion that prevents gasket 26, and hence portion 13, from being inadvertently removed from pins 46. In alternative embodiments, a plastic clip is applied to the ends of pins 46 although in this embodiment, it is important to stagger the orientation of pins 46 so that each pin is aligned with gasket material instead of an opposing pin.

Inner gaskets 29 and 30 each include a channel 57 that forms an entry guide for use with a wired electronic device. When a wire is present, inner gaskets 29 and 30 are splayed at the bottom edge 56 by the presence of such wire. When no wire is in place, bottom edges 56 will be in contact, effectively sealing the channel 57. Typically, the diameter of channel 57 determines the maximum diameter of wire 16 that may be used with housing 12. In one embodiment, channel 57 is about six millimeters (6.0 mm) although there is no practical limitation on selecting other diameters, it being recognized however, that with larger diameter wire, inner gaskets 29 and 30 may need to be correspondingly larger as well.

Members also include a structure 54 that is used to form the hermetic seal about a wire extending from the pouch. More specifically structure 54 on member 19 receives an unattached portion 55 of gasket 25 that is not glued or otherwise attached to member 19. Similarly, structure 54 on member 20 receives an unattached portion 55 of gasket 26. Each structure 54 is aligned and juxtaposed with inner gaskets 29 and 30 so that channel 57 is aligned with a semi-conical channel 58. Semi-conical channel 58 is present in the unattached portion 55. In the presence of a wire, the top section (that is, proximate to portal 17) of unattached portion 55 splays out through a gap 59 in structure 54. Alternatively, gap 59 may be substantially enclosed so that unattached portion 55 is fully retained within structure 54. The top portion of gasket 25 and 26 should be allowed to lie, unfixed, in void 59, so it can be flexed freely through the void when a wire is present.

When members 25 and 26 are aligned in the closed position and gaskets are creating a seal, with a wire in place, the point at which the semi-conical voids in gaskets 25 and 26 match the diameter of the wire, a seal is created. In order to give this seal resistance to pressure, it is necessary to introduce a constrictive force at the point on the semi-conical voids in the gaskets where the wire is in first contact. This constrictive force is achieved by the adjustment of one, or a pair of slide levers 18 that slide on a ramp 61 set in to the exterior surface of members 19 and 20. When sliding the slide lever up the ramp 61, edge 64 of slide lever 18 is caused to come into contact with the 'outside face' of the unattached portion 55 where it is splayed through hole 59. A degree of adjustability on slide lever 18 is provided either through pre-set ratchets 63 or other similar means that allows the seal point caused by edge 64 to be altered in response to the diameter of the wire.

Figure 3:
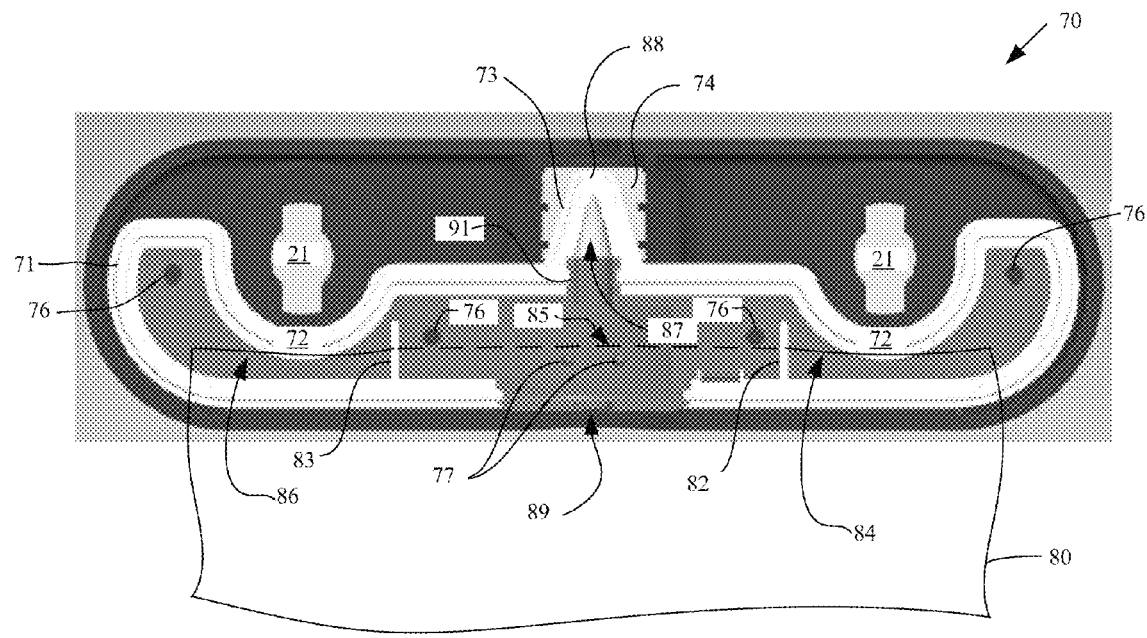
FIG. 3 shows an interior view of one member of the apparatus in accordance with an embodiment of the present invention.

Refer now to FIG. 3 where one member 70 of an alternative embodiment of the present invention is illustrated. It will be recognized that the other member of housing 12 will have a design similar to the design illustrated in FIG. 3 but it will have complimentary structure for receiving, for example, bayonet levers 21. In this embodiment, gasket 71 has a semi-annular portion 72 that enables bayonet levers 21 to pass through the housing while still providing a hermetic seal around an open end of a pouch. Gasket 71 also has unattached portion 73 that is engaged by slide lever 74. Unattached means that portion 73 is not affixed to member 70 and may pivot or bend relative to the remaining portions of gasket 71. Note that structure 54, in this embodiment, is an integrated portion of member 70, which provides both improved aesthetics and functionality.

Seal plate 75 has two primary purposes. First, it is used to hold gasket 70 in place juxtaposed against member 70. In this manner, gasket 71 is sandwiched between a seal plate 75 and member 70 and held in place by a plurality of nibs 76. Nibs 76 are molded into the inside face of member 70 and extend through gasket 71 and seal plate 75. Nibs 76 maybe heated and deformed to form a knob (not illustrated) to ensure a permanent attachment of gasket 71 and seal plate 75 to member 70.

Figure 4:
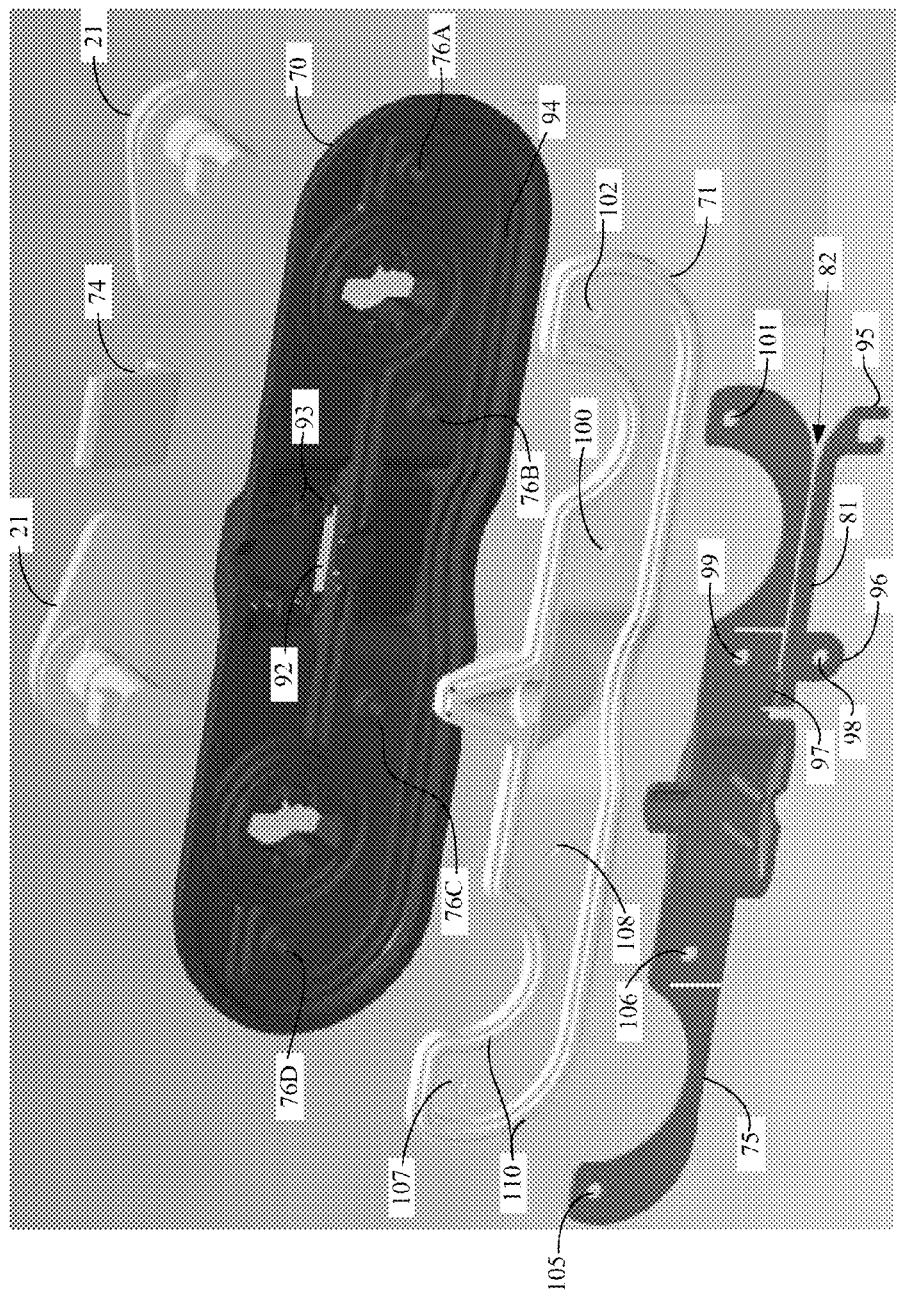
FIG. 4 shows an exploded perspective view of the member shown in FIG. 3 in accordance with an embodiment of the present invention.

The second purpose of seal plate 75 is to secure sheet 80 between clamp bar 81 and seal plate 75. More specifically, clamp bar 81, which is originally below slot 82 as illustrated in FIG. 4, folds over, engages at least two nibs 76 and clamps sheet 80 in place once the nibs are heat treated. It will be apparent to one skilled in the art that clamp bar 81 and seal plate 75 sandwiches sheet 80. Note that clamp bar 81 has been omitted in FIG. 3 to more clearly illustrate other features associated with member 70. Note further that sheet 80 is one of the two sheets that forms pouch 11, which is only partially illustrated in FIG. 3 and the opposing member of the housing has a mirror image of the clamp bar to clamp the other side of the pouch. Thus, both sheets of the pouch are clamped with one sheet permanently coupled to member 70 and the other sheet of the pouch permanently coupled to the opposing member (not shown).

Seal plate 75 also includes a pair of slots 82 and 83 that allows the top edge of sheet 80 to be threaded through slots 82 and 83. Thus, a portion of sheet 80 is sandwiched between clamp bar 81 and seal plate 75 in the area designated at 84. Further, a portion of sheet 80 is sandwiched between seal plate 75 and gasket 71 in the area designated at 85. A third portion of sheet 80, in the area designated at 86 is threaded back through slot 83 such that the third portion and gasket 71 sandwich seal plate 75. Seal plate 75 also includes at least two pins 77 that engage and guide the opposing member to the closed position.

Conical cavity 87 is a critical feature of gasket 71, in this embodiment, because it and the top portion 88 of unattached portion 73 cooperate to seal off the wire portal if a wire is present or if no wire is present. Slide lever 74 forces opposing portions 73 together when members are in the closed position such that respective top portions 88 form a hermetic seal. Note that this is a different sealing method than used in the embodiment shown in FIG. 1.

When a wire is present, it is brought out of the interior of pouch 11 through opening 89 and nipple 91. Nipple 91 is seated inside conical cavity 87. Since sheet 80 is sandwiched behind seal plate 75 in area 85, opening 89 aligns with opening 28 (see FIG. 2).

FIG. 4 is an exploded perspective view of the housing member 70, gasket 71 and seal plate 75 shown in FIG. 3. In this embodiment, slide lever 74 slides through slot 92 in member 70 to engage the unattached portion 73. Detents 93 maintain slide lever 74 in position applying pressure to the unattached portion 73 when housing is in the closed position.

Further, in this embodiment, clamp bar 81 is shown in an initial or open position with a pouch present. Clamp bar 81 consists of a claw 95 and an integral washer 96 at an end of clamp bar 81 opposite from claw 95. Clamp bar 81 is attached to seal plate 75 at crease 97. Once gasket 71 is affixed to member 70, a pouch may be woven through slots 82 and 83 and seal plate 75 may then be affixed to member 70 such that the seal plate and pouch combination and member 70 sandwiches gasket 71.

Once gasket 71 and seal plate 75 are affixed to member 70, nib 76A protrudes through holes 101 and 102 and nib 76B protrudes through holes 99 and 100. Similarly, nibs 76C and 76D protrude through holes 106 and 108 and 105 and 107, respectively. By bending clamp bar 81 so that claw 95 engages nib 76A and nib 76B passes through hole 98, it is possible to clamp the pouch permanently to member 70. When nibs 76 are deformed by a heated element, they form a rivet-like head that prevents the disassembly of the unit or removal of the pouch.

A critical feature of gasket 71 is the ridge 110 that runs along the perimeter of gasket 71 including the unattached portion 73. When ridge 110 is aligned with a corresponding ridge on the opposing member and maintained in a closed configuration with applied pressure to the gaskets, a hermetic seal is formed. As noted above, bayonet levers 21 and housing 12 or 120 preferably apply the necessary sealing pressure to the gaskets. Seal plate 75 preferably has a substantially similar shape as gasket 71 except it is scaled to fit inside of the perimeter ridge 110. Finally, it is noted that member 70 provides a groove 94 adapted to receive a corresponding tongue on the backside of gasket 71. By pressing tongue into groove 94, gasket 71 is affixed to member 70.

Figure 5:
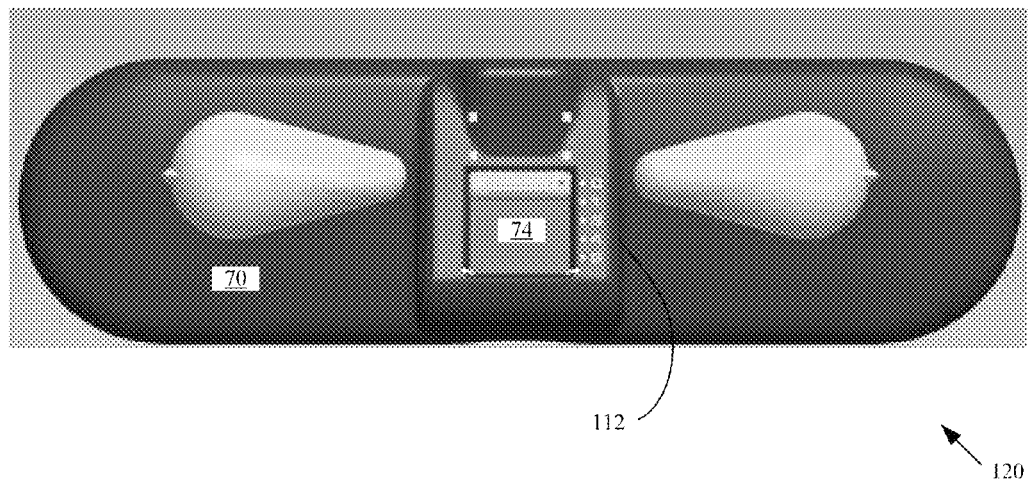
FIG. 5 shows a front view of the exterior face of the member shown in FIG. 3 in accordance with an embodiment of the present invention.
Figure 6:
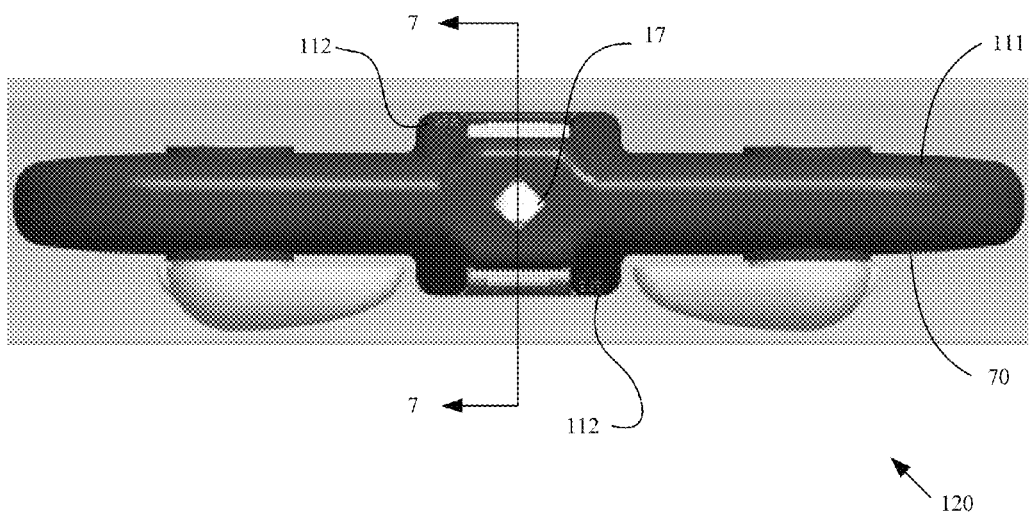
FIG. 6 shows a top view of the two members comprising a housing in accordance with an embodiment of the present invention.

FIGS. 5 and 6 illustrate housing 120 where member 70 and opposing member 111 are maintained in a closed position. In FIG. 5, slide lever 75 is shown in the "zero" position since there is no wire present. By sliding slide lever 75 down to one of the plurality of detents, denoted 1, 3, 4, 5 along the side of ramp housing 112, various gauge wire may be readily accommodated. The view of housing 120 in FIG. 5 illustrates the low profile of member 70 achieved by integrating ramp structure 112 into the outer face. FIG. 6 is a top view of housing 120 showing portal 17 and the dual ramp structures 112 that operate to apply pressure to the unattached portions 73 of the gaskets. It will be appreciated that by changing the dimensions of conical cavity 87, and nipple 91 (see FIG. 4), virtually any size wire may be readily accommodated by housing 120.

Figure 7:
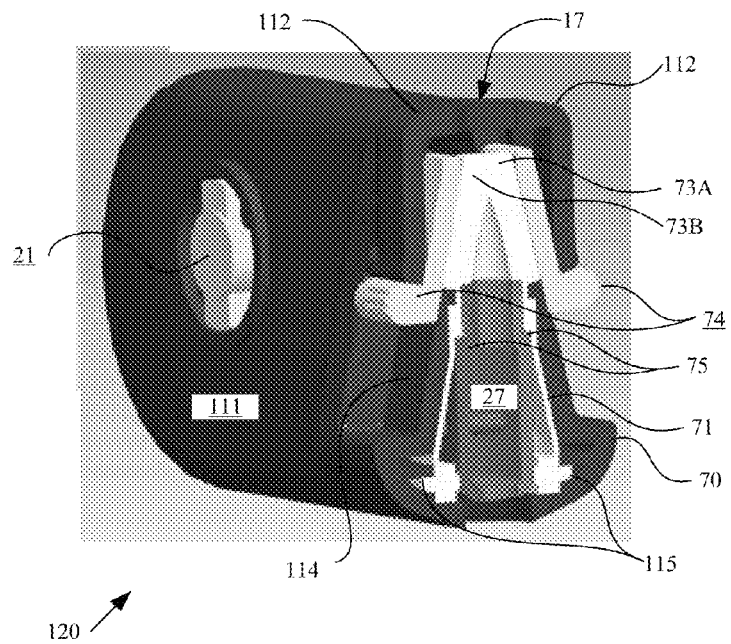
FIG. 7 illustrates a perspective sectional view of the housing shown in FIG. 6 in accordance with an embodiment of the present invention.

FIG. 7 illustrates a sectional perspective view of housing 120 taken along section lines 7-7 of FIG. 6 where again, no wire is present and slide levers 74 are both positioned at the top-most position on ramp 114. In this position, each slide lever 74 applies pressure to the unattached portions 73A and 73B of the gaskets to hermetically seal portal 17.

In one embodiment, the gaskets are affixed to members 70 and 111 by a tongue and groove structure 115 where the gasket's tongue is inserted into corresponding groove 94 molded into the opposing inner faces of housing 120. The gasket is held in place by the friction fit between the tongue and the groove. Epoxy or other agents may be used, either alone or in combination with structure 115, to affix the gasket to the plastic housing.

Sealing plate 75 defines void 27 necessary to bring a wire out of the interior of a pouch. Gaskets 70 and seal plate 75 cooperate to create the hermetic seal around the pouch when housing 120 is in held in the closed position by the levers 21. Within void 27, the open end of the pouch or an open end of a similar pre-formed container is trapped in a 'dry' environment and thus protected from water ingress.

Accordingly, the present invention provides a hermetic seal on one edge of a waterproof pouch or other type of container. The present invention has a housing comprising at least two members that when juxtaposed, form a dry interior region. The dry interior region is defined by a pair of gaskets, which form a hermetic seal about seal plate, which interfaces with the pouch or container to form an exit path for a wire. Preferably, the seal plate includes a pouch-retaining clip that holds the edges of the pouch within the confines of the mechanism so that when two halves of the housing are in an open position, the pouch is securely retained.

Figure 8:
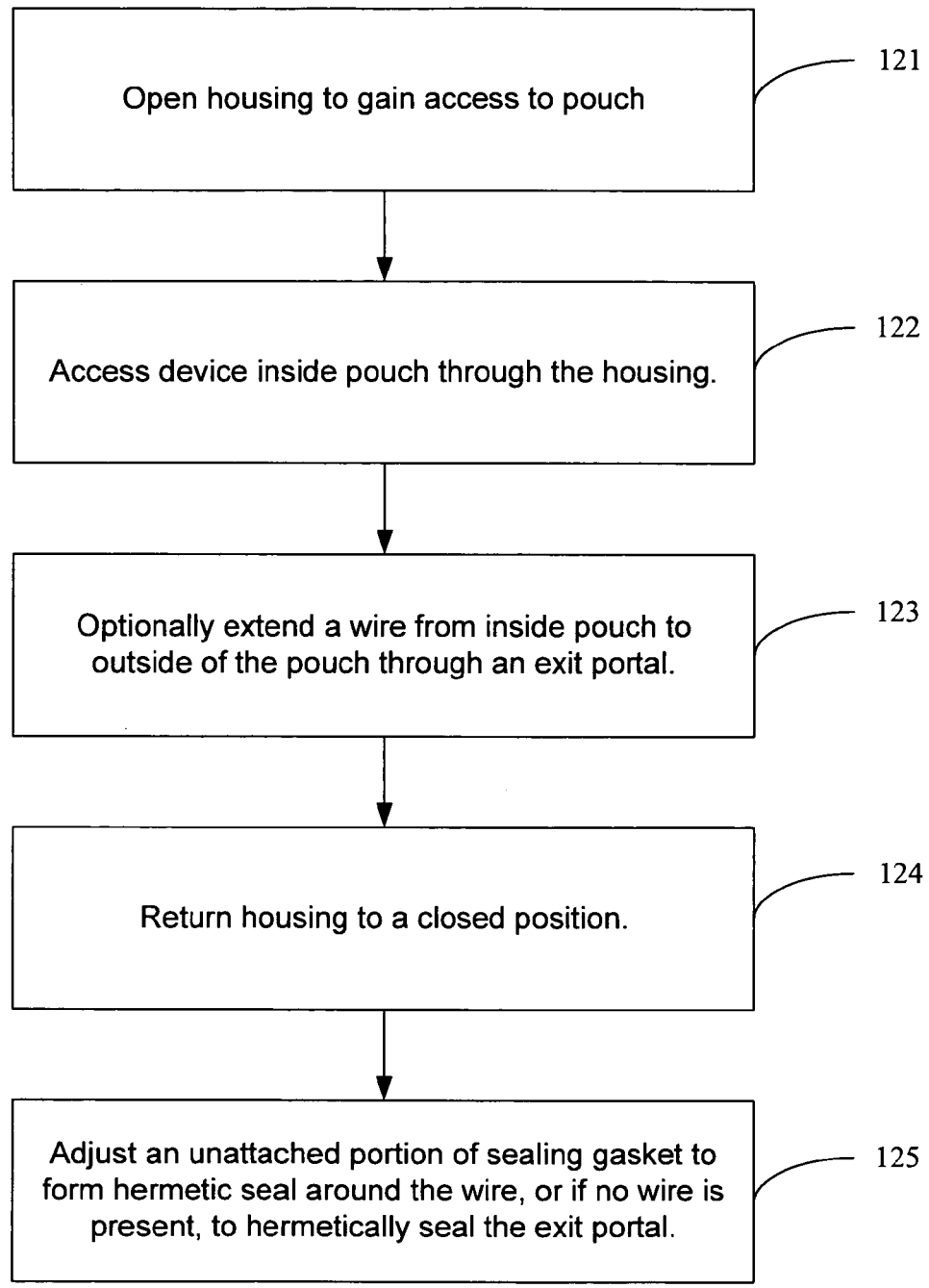
FIG. 8 illustrates operation of an embodiment of the present invention.

Refer now to FIG. 8 where operation of the present invention is described. In a first step 121, the housing is opened to gain access to the interior of the pouch or other container coupled to the housing. During this step, a device, such as a cell phone or a medical device such as an insulin pump may be either placed into the pouch or removed. With the housing in the open position, access to the interior of the pouch is readily available. As indicated at step 122, access into the pouch is through housing 122. Once the device is securely positioned in the pouch, a user may optionally extend a wire from inside the pouch to the outside, as indicated at step 123. This step may require the wire to be grasped and then positioned over in the exit portal of one of the housing members and held in place with a hand or other retaining mechanism. In step 124, the housing is returned to the closed position by operating bayonet levers, one at a time, to clamp both members of the housing together. The clamping action forms a hermetic seal around the top of the pouch. If the wire is present, it will extend out of the portal in the housing while the device remains inside the pouch. Finally, as indicated at step 125, the slide levers are adjusted to form a hermetic seal around the extended wire. If no wire is present, slide levers are adjusted to maintain a hermetic seal so that water cannot enter the pouch through the portal. In other embodiments, step 125 is performed prior to step 124. Thus, a user would adjust the sliders to an initial position, and then close the housing. In this embodiment, the gaskets are subjected to an inward pushing force and minimal sliding force.

Although the invention has been described with respect to specific embodiments thereof, these embodiments are merely illustrative, and not restrictive of the invention. For example, the housing members and gaskets may include a variety of different shapes depending on a specific application. Further, these components may be made from any suitable material so long as the hermetic seal can be formed to define a dry environment around the open end of the pouch or container.

In the description herein, specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention. In general, the functions of the present invention can be achieved by any means as is known in the art.

As used herein, "clamp" for purposes of embodiments of the present invention may be any device, mechanism or structure that can contain maintain the relationship between the clamped elements. For example, but not limitation, the bayonet levers may be replaced with any desired sealing mechanism such as, by way of example but not by limitation, an electronic, magnetic, mechanical system, apparatus, or device that can maintain housing in a closed position and a hermetic seal around portal 17. Similarly, the slide levers may be replaced with any desired sealing mechanism such as, by way of example but not by limitation, an electronic, magnetic, mechanical system, apparatus, or device that can maintain a hermetic seal around portal 17.

As used herein "wire" may include by way of example but not by limitation, any cable, tube or wire of variable circumference. The wire may be used to carry electrical signal, electrical energy, or for other purposes such as to transport fluids.

Reference throughout this specification to "one embodiment," "an embodiment," or "a specific embodiment" means that a particular feature, structure, or characteristic described in connection with the embodiment is included in at least one embodiment of the present invention and not necessarily in all embodiments. Thus, respective appearances of the phrases "in one embodiment," "in an embodiment," or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

It will also be appreciated that one or more of the elements depicted in the drawings/figures can also be implemented in a more separated or integrated manner, or even removed or rendered as inoperable in certain cases, as is useful in accordance with a particular application.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a," "an," and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims.

What is claimed is:

1. An apparatus capable of being repeatedly opened and then hermetically sealed comprising:
   a container formed from a waterproof material, the container suitable for enclosing an electronic device, the electronic device coupled to a wire, the container including an opening for allowing insertion and removal of the electronic device and through which an end of said wire is accessible from outside said container;
   a housing having a pair of opposing members each of which is coupled to said container proximate to said opening, said wire extending through an interior region of said housing;
   a gasket, coupled to said housing, adapted to form a hermetic seal around said wire and said opening when said opposing members are engaged; and
   a wire clamping mechanism for deforming a portion of said gasket around said wire with sufficient force to form a hermetic seal around said wire, wherein said wire clamping mechanism comprises a slide lever positioned on a ramp and adapted to engage said portion of said gasket to selectively adjust pressure on said portion of said gasket.

2. The apparatus of claim 1 wherein said gasket comprises a pair of gaskets, each of which is positioned proximate to one member of said opposing pair of members and between said container and said one member such that said container is sandwiched between said gaskets.

3. The apparatus of claim 2 further comprising a pair of inner gaskets such that each side of said container is sandwiched between one of said pair of inner gaskets and one of said pair of gaskets.

4. The apparatus of claim 2 further comprising a pair of seal plates such that each of said gaskets in said pair of gaskets is sandwiched between one of said seal plates and one member of said pair of opposing members.

5. The apparatus of claim 4 wherein said pair of seal plates each includes a clamp bar for retaining said container.

6. The apparatus of claim 1 wherein said wire clamping mechanism allows for selectively deforming said portion of said gasket to form a hermetic seal in the absence of said wire.

7. The apparatus of claim 6 wherein said portion of said gasket further includes a conical cavity for engaging said wire and said gasket further includes a periphery ridge for engaging a complementary ridge on an opposing gasket.

* * * * *